(12) United States Patent
Li (10) Patent No.: US 10,403,219 B2
(45) Date of Patent: Sep. 3, 2019

(54) GATE DRIVER ON ARRAY CIRCUIT BASED ON LOW TEMPERATURE POLY-SILICON SEMICONDUCTOR THIN FILM TRANSISTOR

(71) Applicant: WUHAN CHINA STAR OPTOELECTRONICS TECHNOLOGY CO., LTD., Wuhan, Hubei (CN)

(72) Inventor: Yafeng Li, Hubei (CN)

(73) Assignee: Wuhan China Star Optoelectronics Technology Co., Ltd., Wuhan, Hubei (CN)

( * ) Notice: Subject to any disclaimer, the term of this patent is extended or adjusted under 35 U.S.C. 154(b) by 0 days.

(21) Appl. No.: 15/312,040

(22) PCT Filed: Jun. 13, 2016

(86) PCT No.: PCT/CN2016/085598
§ 371 (c)(1),
(2) Date: Nov. 17, 2016

(87) PCT Pub. No.: WO2017/197684
PCT Pub. Date: Nov. 23, 2017

(65) Prior Publication Data
US 2018/0108316 A1    Apr. 19, 2018

(30) Foreign Application Priority Data

May 18, 2016   (CN) .......................... 2016 1 0331196

(51) Int. Cl.
*G09G 3/36*     (2006.01)
*G02F 1/1368*   (2006.01)
(Continued)

(52) U.S. Cl.
CPC ......... *G09G 3/3677* (2013.01); *G02F 1/1368* (2013.01); *G02F 1/13454* (2013.01);
(Continued)

(58) Field of Classification Search
CPC . G09G 3/3677; G02F 1/13454; G02F 1/1368; H01L 27/1222; H01L 27/124; H01L 27/1255
See application file for complete search history.

(56) References Cited

U.S. PATENT DOCUMENTS

| 2008/0030445 | A1  | 2/2008 | Choi et al. |
| 2016/0189647 | A1  | 6/2016 | Xiao et al. |
| 2016/0267832 | A1* | 9/2016 | Dai ...................... G09G 3/2092 |

FOREIGN PATENT DOCUMENTS

| CN | 103065593 A | 4/2013 |
| CN | 104537992 A | 4/2015 |

(Continued)

*Primary Examiner* — Wing H Chow
(74) *Attorney, Agent, or Firm* — Muncy, Geissler, Olds & Lowe, P.C.

(57) ABSTRACT

The present disclosure proposes a GOA circuit having GOA units connected in a serial. Each GOA unit includes a scan-control module, an output module, a pull-down module, and an output adjusting module. By using the output adjusting module formed by a ninth TFT, a tenth TFT, an eleventh TFT, and a twelfth TFT, the voltage level of a fourth node transits between the high voltage level and the low voltage level with the second clock signal in either forward scanning or backward scanning. Compared with the conventional technology where the high and low voltage levels of the output terminal are mainly realized using the second TFT, the GOA circuit realizes that the output ability of the output terminal enhances and the charging capacity of in-plane pixels upgrades in the same period of time to improve the display effect of the liquid crystal panel.

7 Claims, 3 Drawing Sheets

(51) Int. Cl.
 G02F 1/1345 (2006.01)
 H01L 27/12 (2006.01)
 G02F 1/1362 (2006.01)
 H01L 29/786 (2006.01)
(52) U.S. Cl.
 CPC ........ *H01L 27/124* (2013.01); *H01L 27/1222* (2013.01); *H01L 27/1255* (2013.01); *G02F 1/136286* (2013.01); *G02F 2202/104* (2013.01); *G09G 2300/0408* (2013.01); *G09G 2310/0251* (2013.01); *G09G 2310/0283* (2013.01); *G09G 2310/0289* (2013.01); *G09G 2310/08* (2013.01); *H01L 29/78672* (2013.01)

(56) References Cited

FOREIGN PATENT DOCUMENTS

| CN | 105336302 A | 2/2016 |
|----|-------------|--------|
| CN | 105355187 A | 2/2016 |

\* cited by examiner

GATE DRIVER ON ARRAY CIRCUIT BASED ON LOW TEMPERATURE POLY-SILICON SEMICONDUCTOR THIN FILM TRANSISTOR

BACKGROUND OF THE INVENTION

1. Field of the Invention

The present invention relates to the field of liquid crystal display, and more particularly, to a gate driver on array (GOA) circuit based on a low temperature poly-silicon (LTPS) semiconductor thin film transistor (TFT) for improving the output ability of output nodes of the GOA circuit.

2. Description of the Prior Art

The gate driver on array (GOA) technique is that, a gate row scanning driving circuit is fabricated on an array substrate based on a conventional thin film transistor-liquid crystal display (TFT-LCD) to make it come true that the gate is driven by being scanned row by row. The adoption of the GOA technique is good for reducing bonding of external integrated circuit (IC), increasing capacity hopefully, and transiting production costs. Further, it is possible to produce a display equipped a liquid crystal panel with no narrow bezels or no bezels based on the GOA technique.

With the development of low temperature poly-silicon (LTPS) semiconductor TFTs, LTPS-TFT liquid crystal displays (LCDs) are also on the spotlight. LTPS-TFT LCDs have merits of high resolution, quick response, high brightness, high aperture rates, etc. Besides, LTPS semiconductors have extra high carrier mobility so gate drivers are installed on a TFT array substrate based on the GOA technique to achieve system integration (SI), save space, and economize costs of driver integrated circuits (driver ICs).

Figure 1:
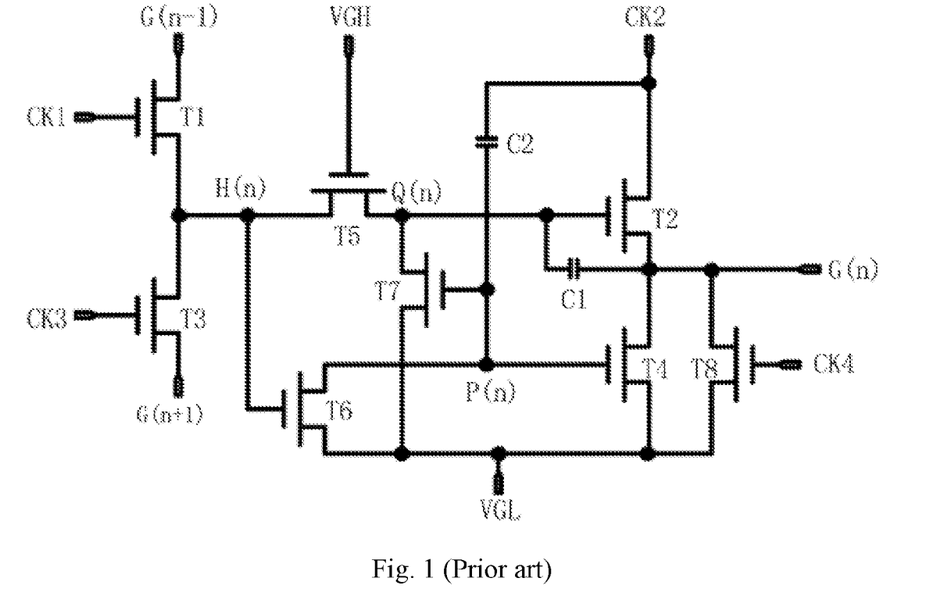
FIG. 1 shows a schematic diagram of a conventional GOA circuit based on an LTPS semiconductor TFT.

Please refer to FIG. 1 showing a schematic diagram of a conventional GOA circuit based on an LTPS semiconductor TFT. The GOA circuit comprises a plurality of GOA units connected in a serial. N is set as a positive integer. An nth stage of GOA unit comprises a first TFT T1, a second TFT T2, a third TFT T3, a fourth TFT T4, a fifth TFT T5, a sixth TFT T6, a seventh TFT T7, an eighth TFT T8, a first capacitor C1, and a second capacitor C2. The first TFT T1 comprises a gate electrically connected to a first clock signal CK1, a source electrically connected to an output terminal G(n−1) of a previous (n−1th) stage of the GOA unit, and a drain electrically connected a third node H(n). The second TFT T2 comprises a gate electrically connected to a first node Q(n), a source electrically connected to a second clock signal CK2, and a drain electrically connected to an output terminal G(n). The third TFT T3 comprises a gate electrically connected to a third clock signal CK3, a drain electrically connected the third node H(n), and a source electrically connected to an output terminal G(n+1) of a following (n+1th) stage of the GOA unit. The fourth TFT T4 comprises a gate electrically connected to a second node P(n), a drain electrically connected to the output terminal G(n), and a source electrically connected to a constant voltage at low voltage level VGL. The fifth TFT T5 comprises a gate electrically connected to a constant voltage at high voltage level VGH, a source electrically connected to the third node H(n), and a drain electrically connected to the first node Q(n). The sixth TFT T6 comprises a gate electrically connected to the third node H(n), a drain electrically connected to the second node P(n), and a source electrically connected to the constant voltage at low voltage level VGL. The seventh TFT T7 comprises a gate electrically connected to the second node P(n), a drain electrically connected to the first node Q(n), and a source electrically connected to the constant voltage at low voltage level VGL. The eighth TFT T8 comprises a gate electrically connected to the second clock signal CK2, a source electrically connected to the output terminal G(n), and a drain electrically connected to the constant voltage at low voltage level VGL. One terminal of the first capacitor C1 is electrically connected to the first node Q(n), and the other terminal is electrically connected to the output terminal G(n). One terminal of the second capacitor C2 is electrically connected to the second node P(n), and the other terminal is electrically connected to the second clock signal CK2.

Figure 2:
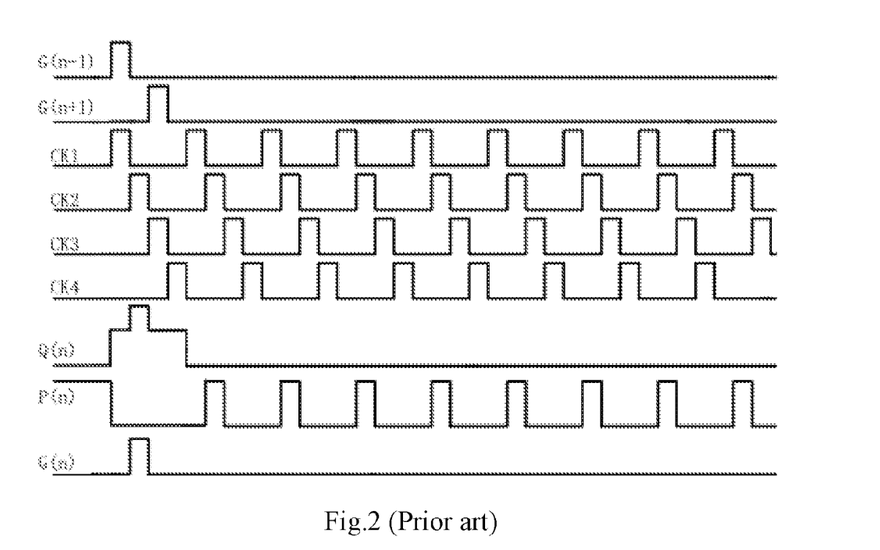
FIG. 2 shows a timing diagram of a conventional GOA circuit based on the LTPS semiconductor TFT in forward scanning as FIG. 1 shows.

The GOA circuit as shown in FIG. 1 can be scanned forward or backward. The workflow of the forward scanning is similar to that of the backward scanning. Please refer to FIG. 1 and FIG. 2. The GOA circuit is scanned forward herein. FIG. 2 shows a timing diagram of a conventional GOA circuit based on the LTPS semiconductor TFT in forward scanning as FIG. 1 shows. The workflow of the GOA circuit based on the LTPS semiconductor TFT in forward scanning is as follows: Stage 1: The output terminal G(n−1) and the first clock signal CK1 both supply high voltage level; the first TFT T1 is conducted; the gate of the fifth TFT T5 is connected to a constant voltage at high voltage level VGH so the fifth TFT T5 keeps conducted; the third node H(n) is precharged to be at the high voltage level, and the sixth TFT T6 is conducted; the level of the third node H(n) is the same as the level of the first node Q(n); the first node Q(n) is precharged to be at the high voltage level, the second node P(n) is pulled down, and the fourth and seventh TFTs T4, T7 terminate. Stage 2: The output terminal G(n−1) and the first clock signal CK1 drop to the low voltage level, and the second clock signal CK2 supplies the high voltage level; the first node Q(n) keeps the high voltage level because of the storage function of the first capacitor C1, the second TFT T2 is conducted, the high voltage level of the second clock signal CK2 is output to the output terminal G(n), the output terminal G(n) outputs the high voltage level, and the first node Q(n) is lifted to a higher voltage level. Stage 3: The third clock signal CK3 and the output terminal G(n+1) both supply the high voltage level, and the first node Q(n) keeps the high voltage level; the second clock signal CK2 drops to the low voltage level, the low voltage level of the second clock signal CK2 is output to the output terminal G(n), and the output terminal G(n) outputs the low voltage level. Stage 4: The first clock signal CK1 supplies the high voltage level again, the output terminal G(n−1) keeps the low voltage level, the first TFT T1 is conducted so the first node Q(n) is pulled down to the constant voltage at low voltage level VGL, and the sixth TFT T6 terminates. Stage 5: The second clock signal CK2 jumps to the high voltage level; because the second capacitor C2 has the function of bootstrap, the second node P(n) is charged to the high voltage level and the fourth and seventh TFTs T4, T7 are conducted to keep the first node Q(n) and the output terminal G(n) the low voltage level.

In the conventional technology, the high and low voltage levels of the output terminal G(n) are mainly realized using the second TFT T2. After the first node Q(n) is precharged and the second clock signal CK2 is high, the output terminal G(n) is pulled up using the second TFT T2. After the first node Q(n) is precharged and the second clock signal CK2 is low, the output terminal G(n) is pulled down using the second TFT T2. But the charging capacity of the second TFT T2 is restricted in a certain period of time. Especially, the higher the number of pixel per inch (PPI) on an image is, the less the charging time harshly reduces. In this way, it is probably that the output terminal G(n) fails to reach the required electric level or that the corresponding RC delay takes long time. These probabilities affect charging of the in-plane pixels and display of the liquid crystal panel.

Therefore, an object of the present invention is to propose a new GOA circuit to improve the output ability of the output nodes of the GOA circuit.

SUMMARY OF THE INVENTION

An object of the present invention is to propose a GOA circuit based on an LTPS semiconductor TFT. Compared with the conventional GOA circuit based on the conventional LTPS semiconductor TFT, the GOA circuit based on the LTPS semiconductor TFT proposed by the present invention has a higher output ability at the output node G(n) in the same period of time. So the GOA circuit proposed by the present invention has a higher charging capacity of in-plane pixels and a higher loading capacity to improve the display effect of the liquid crystal panel.

According to the present invention, a gate driver on array (GOA) circuit based on a low temperature poly-silicon (LTPS) semiconductor thin film transistor (TFT) is proposed. The GOA circuit comprises a plurality of GOA units connected in a serial, and each stage of the plurality of GOA units comprises a scan-control module, an output module, a pull-down module, and an output adjusting module, where n set as a positive integer, except a first stage of the GOA unit and a last stage of the GOA unit in an nth stage of the GOA unit. The scan-control module comprises: a first TFT, comprising a gate electrically connected to a first clock signal, a source electrically connected to an output terminal G(n−1) of a previous (n−1 th) stage of the GOA unit, and a drain electrically connected a third node; a third TFT, comprising a gate electrically connected to a third clock signal, a source electrically connected to an output terminal G(n+1) of a following (n+1th) stage of the GOA unit, and a drain electrically connected to the third node; and a fifth TFT, comprising a gate electrically connected to a constant voltage at high voltage level, a source electrically connected to the third node, and a drain electrically connected to a first node. The output module comprises: a second TFT, comprising a gate electrically connected to the first node, a source electrically connected to a second clock signal, and a drain electrically connected to an output terminal G(n); and a first bootstrap capacitor, electrically connected between the first node and the output terminal G(n). The pull-down module comprises: a fourth TFT, comprising a gate electrically connected to a second node, a source electrically connected to a constant voltage at low voltage level, and a drain electrically connected to the output terminal G(n); a sixth TFT, comprising a gate electrically connected to the third node, a source electrically connected to the constant voltage at low voltage level, and a drain electrically connected to the second node; a seventh TFT, comprising a gate electrically connected to the second node, a source electrically connected to the constant voltage at low voltage level, and a drain electrically connected to the first node; an eighth TFT, comprising a gate electrically connected to the fourth clock signal, a source electrically connected to the constant voltage at low voltage level, and a drain electrically connected to the output terminal G(n); and a second bootstrap capacitor, electrically connected between the second node and the second clock signal. The output adjusting module comprises: a ninth TFT, comprising a gate electrically connected to the second clock signal, a source electrically connected to the constant voltage at high voltage level, and a drain electrically connected to a fourth node; a tenth TFT, comprising a gate electrically connected to the first node, a source electrically connected to the fourth node, and a drain electrically connected to the output terminal G(n); an eleventh TFT, comprising a gate electrically connected to the output terminal G(n−1), a source electrically connected to the constant voltage at low voltage level, and a drain electrically connected to the fourth node; and a twelfth TFT, comprising a gate electrically connected to the output terminal G(n+1), a source electrically connected to the constant voltage at low voltage level, and a drain electrically connected to the fourth node.

In the present invention, an output adjusting module comprising a ninth TFT T9, a tenth TFT T10, an eleventh TFT T11, and a twelfth TFT T12 is introduced. The voltage level of a fourth node M(n) transits between the high voltage level and the low voltage level with the second clock signal CK2 in either forward scanning or backward scanning so the same transition between high and low voltage levels happens. Compared with the conventional technology where the high and low voltage levels of the output terminal G(n) are mainly realized using the second TFT T2, the GOA circuit based on the LTPS semiconductor TFT proposed by the present invention realizes that the output ability of the output terminal G(n) enhances and the charging capacity of in-plane pixels upgrades to a certain extent in the same period of time to improve the display effect of the liquid crystal panel. The GOA circuit proposed by the present invention can be applied to drive cellphones, displays, or televisions.

The above-mentioned is the advantages of the present invention.

DETAILED DESCRIPTION OF THE PREFERRED EMBODIMENTS

A gate driver on array (GOA) circuit based on a low temperature poly-silicon (LTPS) semiconductor thin-film transistor (TFT) proposed by the present invention as well as the attached figures is detailed.

Figure 3:
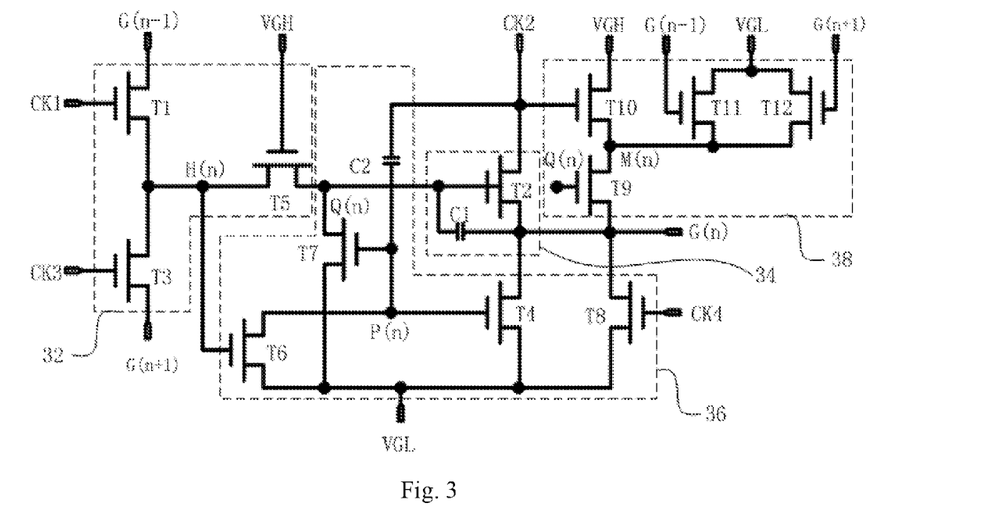
FIG. 3 shows a schematic diagram of the GOA circuit based on the LTPS semiconductor TFT according to one preferred embodiment of the present invention.

Please refer to FIG. 3 showing a schematic diagram of the GOA circuit based on the LTPS semiconductor TFT according to one preferred embodiment of the present invention. The GOA circuit comprises a plurality of GOA units connected in a serial. Each stage of the plurality of GOA units comprises a scan-control module 32, an output module 34, a pull-down module 36, and an output adjusting module 38.

In the nth stage of GOA unit, except a first stage of GOA unit and a last stage of GOA unit, the scan-control module 32 comprises a first TFT T1, a third TFT T3, and a fifth TFT T5. The output module 34 comprises a second TFT T2 and a first bootstrap capacitor C1. The pull-down module 36 comprises a fourth TFT T4, a sixth TFT T6, a seventh TFT T7, an eighth TFT T8, and a second bootstrap capacitor C2. The output adjusting module 38 comprises a ninth TFT T9, a tenth TFT T10, an eleventh TFT T11, and a twelfth TFT T12. N is set as a positive integer.

In the scan-control module 32, the first TFT T1 comprises a gate electrically connected to a first clock signal CK1, a source electrically connected to an output terminal G(n−1) of a previous (n−1th) stage of the GOA unit, and a drain electrically connected to a third node H(n). The third TFT T3 comprises a gate electrically connected to a third clock signal CK3, a source electrically connected to an output terminal G(n+1) of a following (n+1th) stage of the GOA unit, and a drain electrically connected to the third node H(n). The fifth TFT T5 comprises a gate electrically connected to a constant voltage at high voltage level VGH, a source electrically connected to the third node H(n), and a drain electrically connected to a first node Q(n).

In the output module 34, the second TFT T2 comprises a gate electrically connected to the first node Q(n), a source electrically connected to a second clock signal CK2, and a drain electrically connected to an output terminal G(n). One terminal of the first bootstrap capacitor C1 is electrically connected to the first node Q(n), and the other terminal is electrically connected to the output terminal G(n).

In the pull-down module 36, the fourth TFT T4 comprises a gate electrically connected to the second node P(n), a source electrically connected to a constant voltage at low voltage level VGL, and a drain electrically connected to the output terminal G(n). The sixth TFT T6 comprises a gate electrically connected to the third node H(n), a source electrically connected to the constant voltage at low voltage level VGL, and a drain electrically connected to the second node P(n). The seventh TFT T7 comprises a gate electrically connected to the second node P(n), a source electrically connected to the constant voltage at low voltage level VGL, and a drain electrically connected to the first node Q(n). The eighth TFT T8 comprises a gate electrically connected to the fourth clock signal CK4, a source electrically connected to the constant voltage at low voltage level VGL, and a drain electrically connected to the output terminal G(n). One terminal of the second bootstrap capacitor C2 is electrically connected to the second node P(n), and the other terminal is electrically connected to the second clock signal CK2.

In the output adjusting module 38, the ninth TFT T9 comprises a gate electrically connected to the second clock signal CK2, a source electrically connected to the constant voltage at high voltage level VGH, and a drain electrically connected to a fourth node M(n). The tenth TFT T10 comprises a gate electrically connected to the first node Q(n), a source electrically connected to the fourth node M(n), and a drain electrically connected to the output terminal G(n). The eleventh TFT T11 comprises a gate electrically connected to the output terminal G(n−1), a source electrically connected to the constant voltage at low voltage level VGL, and a drain electrically connected to the fourth node M(n). The twelfth TFT T12 comprises a gate electrically connected to the output terminal G(n+1), a source electrically connected to the constant voltage at low voltage level VGL, and a drain electrically connected to the fourth node M(n).

Each of the TFTs adopted in the present invention is the LTPS semiconductor TFT.

The GOA circuit comprises the four clock signals, that is, the first clock signal CK1, the second clock signal CK2, the third clock signal CK3, and the fourth clock signal CK4. The pulses of the four clock signals are sequentially output in turns and never overlap.

Especially, in the first stage of the GOA unit, the source of the first TFT T1 is electrically connected to a circuit onset signal STV. In the last stage of the GOA unit, the source of the third TFT T3 is electrically connected to the circuit onset signal STV. The GOA circuit based on the LTPS semiconductor TFT proposed by this present invention can be scanned from the first stage to the last stage one by one in forward scanning or from the last stage to the first scanning one by one in backward scanning. In forward scanning, the first TFT T1 is supplied with a first clock signal (i.e., the first clock CK1 at the high voltage level) and the circuit onset signal STV at first. In other words, the first clock CK1 electrically connected to the first TFT T1 and the output terminal G(n−1) of the previous stage of the GOA circuit (the n−1th stage) supplies the high voltage level at the same time in forward scanning. In backward scanning, the third TFT T3 is supplied with a first clock signal (i.e., the third clock CK3 at the high voltage level) and the circuit onset signal STV at first. In other words, the third clock CK3 electrically connected to the third TFT T3 and the output terminal G(n+1) of the following stage of the GOA circuit (the n+1th stage) supplies the high voltage level at the same time in backward scanning.

In the GOA circuit based on the LTPS semiconductor TFT, the voltage level of the fourth node M(n) transits between the high voltage level and the low voltage level with the second clock signal CK2 in either forward scanning or backward scanning so the same transition between high and low voltage levels happens. Compared with the conventional technology, the GOA circuit proposed by the present invention realizes that the output ability of the output terminal G(n) enhances and the charging capacity of in-plane pixels upgrades to a certain extent in the same period of time to further improve the display effect of the liquid crystal panel.

Figure 4:
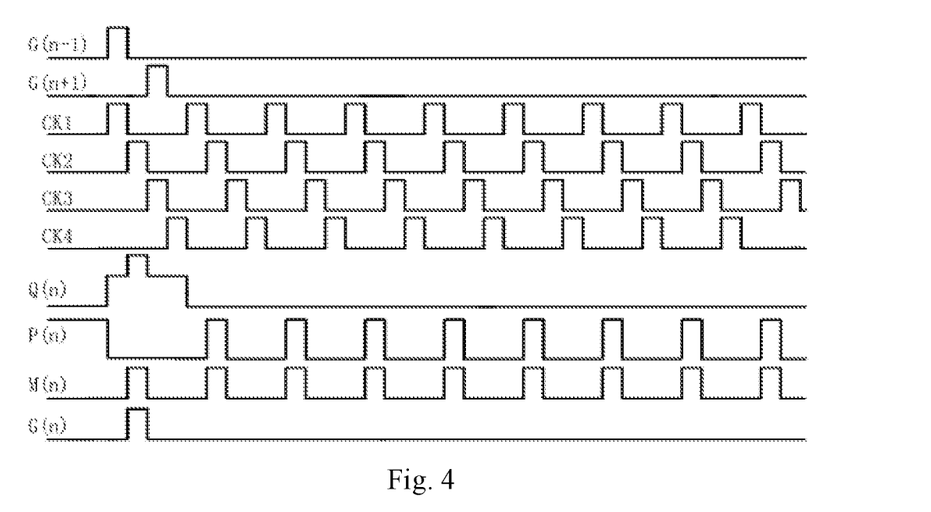
FIG. 4 shows a timing diagram of the GOA circuit based on the LTPS semiconductor TFT in forward scanning as FIG. 3 shows.

Please refer to FIG. 4 showing a timing diagram of the GOA circuit based on the LTPS semiconductor TFT in forward scanning as FIG. 3 shows. The workflow of the GOA circuit based on the LTPS semiconductor TFT in forward scanning is as follows:

Stage 1: The first clock signal CK1 and the output terminal G(n−1) both supply the high voltage level. The second, third, and fourth clock signals CK2, CK3, CK4 all supply the low voltage level. The output terminal G(n+1) also supplies the low voltage level. The first TFT T1 is conducted by the first clock signal CK1. The third node H(n) is precharged to the high voltage level. The sixth TFT T6 controlled by the third node H(n) is conducted. The fifth TFT T5 keeps conducted all the time under the control of the constant voltage at high voltage level VGH so the third node H(n) and the first node Q(n) have the same level at all times. The first node Q(n) is precharged to the high voltage level. The second node P(n) is pulled down to the constant voltage at low voltage level VGL. At last, the fourth and seventh TFTs T4, T7 controlled by the second node P(n) terminate. Meanwhile, the eleventh TFT T11 is conducted and the fourth node M(n) is pulled down because the output terminal G(n−1) supplies high voltage level.

Stage 2: The first clock signal CK1 and the output terminal G(n−1) both drop to the low voltage level. The second clock signal CK2 supplies the high voltage level. The third and fourth clock signals CK3, CK4 and the output terminal G(n+1) still supply the low voltage level. The first node Q(n) keeps the high voltage level because of storage of the first bootstrap capacitor C1. The second TFT T2 is conducted. The high voltage level of the second clock signal CK2 is output to the output terminal G(n), and then the output terminal G(n) outputs the high voltage level, and finally the first node Q(n) is lifted to a higher voltage level. The sixth TFT T6 still keeps conducted. The second node P(n) keeps the constant voltage at low voltage level VGL. At last, the fourth and seventh TFTs T4, T7 controlled by the second node P(n) still terminate. Meanwhile, because the second clock signal CK2 supplies high voltage level, the ninth TFT T9 is conducted, and the fourth node M(n) is precharged to the constant voltage at high voltage level VGH; the tenth TFT T10 is conducted, and the output terminal G(n) is charged from the high voltage level of the fourth node M(n).

Stage 3: The second clock signal CK2 drops to the low voltage level. The third clock signal CK3 and the output terminal G(n+1) both supply the high voltage level. The first and fourth clock signals CK1, CK4 and the output terminal G(n−1) still supply the low voltage level. The third TFT T3 controlled by the third clock signal CK3 is conducted. The first node Q(n) keeps the high voltage level. The second and sixth TFTs T2, T6 are still conducted. The second node P(n) still keeps the constant voltage at low voltage level VGL. The fourth and seventh TFTs T4, T7 controlled by the second node P(n) still terminate. Because the second TFT T2 is still conducted, the low voltage level of the second clock signal CK2 is output to the output terminal G(n), and then the output terminal G(n) is pulled down. Meanwhile, the second clock signal CK2 supplies the low voltage level, and the ninth TFT T9 terminates. Because the output terminal G(n+1) supplies the high voltage level, the twelfth TFT T12 is conducted, and the fourth node M(n) is precharged to the constant voltage at low voltage level VGL. The tenth TFT T10 still keeps conducted, and the fourth node M(n) at low voltage level also has an effect on pulling the output terminal G(n) down.

Stage 4: The first clock signal CK1 supplies the high voltage level again. The second, third, and fourth clock signals CK2, CK3, CK4, and the output terminal G(n−1) supply the low voltage level. The first TFT T1 is conducted by the first clock signal CK1. The first node Q(n) is pulled down to the constant voltage at low voltage level VGL. At last, the second and sixth TFTs T2, T6 terminate.

Stage 5: The second clock signal CK2 supplies the high voltage level again. The first clock signal CK1 drops to the low voltage level. The third and fourth clock signals CK3, CK4 and the output terminals G(n−1), G(n+1) supply the low voltage level. Because the second bootstrap capacitor C2 bootstraps, the second node P(n) is charged to the high voltage level. The fourth and seventh TFTs T4, T7 are conducted, so the first node Q(n) and the output terminal G(n) keep the low voltage level.

In the conventional technology, the high and low voltage levels of the output terminal G(n) are mainly realized using the second TFT T2, but the charging capacity of the second TFT T2 is restricted in a certain period of time. For the GOA circuit based on the LTPS semiconductor TFT proposed by the present invention, the output adjusting module 38 formed by the ninth TFT T9, the tenth TFT T10, the eleventh TFT T11, and the twelfth TFT T12 in the precharging stage (Stage 1) of the first node Q(n) enhances the output ability of the output terminal G(n) and improve the charging capacity of in-plane pixels to a certain extent in the same period of time to make the display effect of the liquid crystal panel much better.

Figure 5:
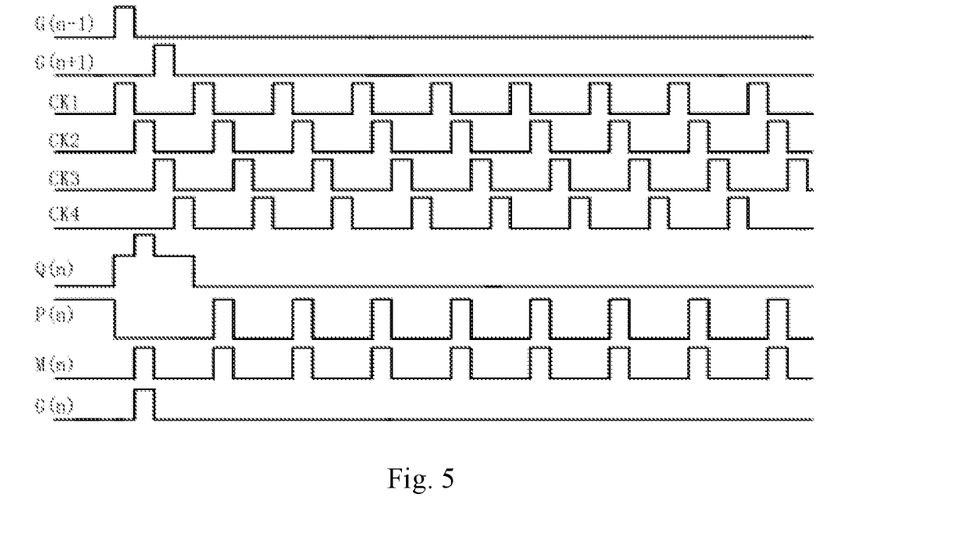
FIG. 5 showing a timing diagram of the GOA circuit based on the LTPS semiconductor TFT in backward scanning as FIG. 3 shows.

Please refer to FIG. 5 showing a timing diagram of the GOA circuit based on the LTPS semiconductor TFT in backward scanning as FIG. 3 shows. The workflow of the forward scanning is similar to that of the backward scanning. The workflow of the GOA circuit based on the LTPS semiconductor TFT in backward scanning is outlined as follows.

Stage 1: The third clock signal CK3 and the output terminal G(n+1) both supply the high voltage level. The third TFT T3 is conducted by the third clock signal CK3. The third node H(n) is precharged to the high voltage level. The sixth TFT T6 is conducted by the third node H(n). The fifth TFT T5 keeps conducted all the time under the control of the constant voltage at high voltage level VGH so the third node H(n) and the first node Q(n) have the same level at all times. The first node Q(n) is precharged to the high voltage level. The second node P(n) is pulled down to the constant voltage at low voltage level VGL. At last, the fourth and seventh TFTs T4, T7 terminate. Meanwhile, because the output terminal G(n+1) supplies high voltage level, the twelfth TFT T12 is conducted, and the fourth node M(n) is pulled down.

Stage 2: The second clock signal CK2 supplies the high voltage level. The first node Q(n) keeps the high voltage level because of storage of the first bootstrap capacitor C1. The second TFT T2 is conducted. The high voltage level of the second clock signal CK2 is output to the output terminal G(n), and then the output terminal G(n) outputs the high voltage level, and finally the first node Q(n) is lifted to a higher voltage level. Meanwhile, because the second clock signal CK2 supplies high voltage level, the ninth TFT T9 is conducted, and the fourth node M(n) is precharged to the constant voltage at high voltage level VGH; the tenth TFT T10 is conducted, and the output terminal G(n) is charged from the high voltage level of the fourth node M(n).

Stage 3: The second clock signal CK2 drops to the low voltage level. The first clock signal CK1 and the output terminal G(n−1) both supply the high voltage level. The first node Q(n) still at the high voltage level. The second TFT T2 is still conducted. The low voltage level of the second clock signal CK2 is output to the output terminal G(n), and then the output terminal G(n) outputs the low voltage level. Meanwhile, the second clock signal CK2 supplies the low voltage level, and the ninth TFT T9 terminates. Because the output terminal G(n−1) supplies high voltage level, the eleventh TFT T11 is conducted, and the fourth node M(n) is precharged to the constant voltage at low voltage level VGL. The tenth TFT T10 still keeps conducted, and the fourth node M(n) at low voltage level also has an effect on pulling the output terminal G(n) down.

Stage 4: The third clock signal CK3 supplies the high voltage level again. The output terminal G(n+1) supplies the low voltage level. The third TFT T3 is conducted. The first node Q(n) is pulled down to the constant voltage at low voltage level VGL.

Stage 5: The second clock signal CK2 supplies the high voltage level again. The third clock signal CK3 drops to the low voltage level. Because the second bootstrap capacitor C2 bootstraps, the second node P(n) is charged to the high voltage level. The fourth and seventh TFTs T4, T7 are conducted, so the first node Q(n) and the output terminal G(n) keep the low voltage level.

In the conventional technology, the high and low voltage levels of the output terminal G(n) are mainly realized using the second TFT T2, but the charging capacity of the second TFT T2 is restricted in a certain period of time. For the GOA circuit based on the LTPS semiconductor TFT proposed by the present invention, the output adjusting module 38 formed by the ninth TFT T9, the tenth TFT T10, the eleventh TFT T11, and the twelfth TFT T12 in the precharging stage (Stage 1) of the first node Q(n) enhances the output ability of the output terminal G(n) and improve the charging capacity of in-plane pixels to a certain extent in the same period of time to make the display effect of the liquid crystal panel much better.

In sum, the present disclosure proposes an output adjusting module comprising a ninth TFT T9, a tenth TFT T10, an eleventh TFT T11, and a twelfth TFT T12. The voltage level of a fourth node M(n) transits between the high voltage level and the low voltage level with the second clock signal CK2 in either forward scanning or backward scanning so the same transition between high and low voltage levels happens. Compared with the conventional technology where the high and low voltage levels of the output terminal G(n) are mainly realized using the second TFT T2, the GOA circuit based on the LTPS semiconductor TFT proposed by the present invention realizes that the output ability of the output terminal G(n) enhances and the charging capacity of in-plane pixels upgrades to a certain extent in the same period of time to improve the display effect of the liquid crystal panel. The GOA circuit proposed by the present invention can be applied to drive cellphones, displays, or televisions. The above-mentioned is the advantages of the present invention.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A gate driver on array (GOA) circuit based on a low temperature poly-silicon (LTPS) semiconductor thin film transistor (TFT), comprising a plurality of GOA units connected in a serial, and each stage of the plurality of GOA units comprises a scan-control module, an output module, a pull-down module, and an output adjusting module;
n set as a positive integer, except a first stage of the GOA unit and a last stage of the GOA unit, in an nth stage of the GOA unit:
the scan-control module comprising:
a first TFT, comprising a gate electrically connected to a first clock signal, a source electrically connected to an output terminal G(n−1) of a previous (n−1th) stage of the GOA unit, and a drain electrically connected a third node;
a third TFT, comprising a gate electrically connected to a third clock signal, a source electrically connected to an output terminal G(n+1) of a following (n+1th) stage of the GOA unit, and a drain electrically connected to the third node; and
a fifth TFT, comprising a gate electrically connected to a constant voltage at high voltage level, a source electrically connected to the third node, and a drain electrically connected to a first node;
the output module comprising:
a second TFT, comprising a gate electrically connected to the first node, a source electrically connected to a second clock signal, and a drain electrically connected to an output terminal G(n); and
a first bootstrap capacitor, electrically connected between the first node and the output terminal G(n);

the pull-down module comprising:
a fourth TFT, comprising a gate electrically connected to a second node, a source electrically connected to a constant voltage at low voltage level, and a drain electrically connected to the output terminal G(n);
a sixth TFT, comprising a gate electrically connected to the third node, a source electrically connected to the constant voltage at low voltage level, and a drain electrically connected to the second node;
a seventh TFT, comprising a gate electrically connected to the second node, a source electrically connected to the constant voltage at low voltage level, and a drain electrically connected to the first node;
an eighth TFT, comprising a gate electrically connected to the fourth clock signal, a source electrically connected to the constant voltage at low voltage level, and a drain electrically connected to the output terminal G(n); and
a second bootstrap capacitor, electrically connected between the second node and the second clock signal; and
the output adjusting module comprising:
a ninth TFT, comprising a gate electrically connected to the second clock signal, a source electrically connected to the constant voltage at high voltage level, and a drain electrically connected to a fourth node;
a tenth TFT, comprising a gate electrically connected to the first node, a source electrically connected to the fourth node, and a drain electrically connected to the output terminal G(n);
an eleventh TFT, comprising a gate electrically connected to the output terminal G(n−1), a source electrically connected to the constant voltage at low voltage level, and a drain electrically connected to the fourth node; and
a twelfth TFT, comprising a gate electrically connected to the output terminal G(n+1), a source electrically connected to the constant voltage at low voltage level, and a drain electrically connected to the fourth node,
wherein all of the TFTs are LTPS semiconductor TFTs,
wherein pulses of the first clock signal, the second clock signal, the third clock signal, and the fourth clock signal are sequentially output in turns and never overlap, and
wherein the voltage level of the fourth node transits between high voltage level and low voltage level with the second clock signal so the same transition between the high voltage level and the low voltage level happens.

2. The GOA circuit of claim 1, wherein in forward scanning, the first clock signal electrically connected to the first TFT and the output terminal G(n−1) both supply the high voltage level; in backward scanning, the third clock signal electrically connected to the third TFT and the output terminal G(n+1) both supply the high voltage level.

3. A gate driver on array (GOA) circuit based on a low temperature poly-silicon (LTPS) semiconductor thin film transistor (TFT), comprising a plurality of GOA units connected in a serial, and each stage of the plurality of GOA units comprises a scan-control module, an output module, a pull-down module, and an output adjusting module;
n set as a positive integer, except a first stage of the GOA unit and a last stage of the GOA unit, in an nth stage of the GOA unit:
the scan-control module comprising:
a first TFT, comprising a gate electrically connected to a first clock signal, a source electrically connected to an output terminal G(n−1) of a previous (n−1th) stage of the GOA unit, and a drain electrically connected a third node;

a third TFT, comprising a gate electrically connected to a third clock signal, a source electrically connected to an output terminal G(n+1) of a following (n+1th) stage of the GOA unit, and a drain electrically connected to the third node; and a fifth TFT, comprising a gate electrically connected to a constant voltage at high voltage level, a source electrically connected to the third node, and a drain electrically connected to a first node;

the output module comprising:

a second TFT, comprising a gate electrically connected to the first node, a source electrically connected to a second clock signal, and a drain electrically connected to an output terminal G(n); and a first bootstrap capacitor, electrically connected between the first node and the output terminal G(n);

the pull-down module comprising:

a fourth TFT, comprising a gate electrically connected to a second node, a source electrically connected to a constant voltage at low voltage level, and a drain electrically connected to the output terminal G(n);

a sixth TFT, comprising a gate electrically connected to the third node, a source electrically connected to the constant voltage at low voltage level, and a drain electrically connected to the second node;

a seventh TFT, comprising a gate electrically connected to the second node, a source electrically connected to the constant voltage at low voltage level, and a drain electrically connected to the first node;

an eighth TFT, comprising a gate electrically connected to the fourth clock signal, a source electrically connected to the constant voltage at low voltage level, and a drain electrically connected to the output terminal G(n); and a second bootstrap capacitor, electrically connected between the second node and the second clock signal; and the output adjusting module comprising:

a ninth TFT, comprising a gate electrically connected to the second clock signal, a source electrically connected to the constant voltage at high voltage level, and a drain electrically connected to a fourth node;

a tenth TFT, comprising a gate electrically connected to the first node, a source electrically connected to the fourth node, and a drain electrically connected to the output terminal G(n);

an eleventh TFT, comprising a gate electrically connected to the output terminal G(n−1), a source electrically connected to the constant voltage at low voltage level, and a drain electrically connected to the fourth node; and a twelfth TFT, comprising a gate electrically connected to the output terminal G(n+1), a source electrically connected to the constant voltage at low voltage level, and a drain electrically connected to the fourth node.

4. The GOA circuit of claim 3, wherein the voltage level of the fourth node transits between high voltage level and low voltage level with the second clock signal so the same transition between the high voltage level and the low voltage level happens.

5. The GOA circuit of claim 3, wherein pulses of the first clock signal, the second clock signal, the third clock signal, and the fourth clock signal are sequentially output in turns and never overlap.

6. The GOA circuit of claim 3, wherein in forward scanning, the first clock signal electrically connected to the first TFT and the output terminal G(n−1) both supply the high voltage level; in backward scanning, the third clock signal electrically connected to the third TFT and the output terminal G(n+1) both supply the high voltage level.

7. The GOA circuit of claim 3, wherein all of the TFTs are LTPS semiconductor TFTs.

\* \* \* \* \*